United States Patent
Stevens et al.

(10) Patent No.: US 6,693,671 B1
(45) Date of Patent: Feb. 17, 2004

(54) FAST-DUMP STRUCTURE FOR FULL-FRAME IMAGE SENSORS WITH LOD ANTIBLOOMING STRUCTURES

(75) Inventors: Eric G. Stevens, Rochester, NY (US); William F. Desjardin, Holley, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/533,051

(22) Filed: Mar. 22, 2000

(51) Int. Cl.[7] .............................................. H04N 5/335
(52) U.S. Cl. ...................... 348/314; 348/315; 348/299
(58) Field of Search ................................ 348/294, 298, 348/299, 311, 314, 315, 316; 257/292, 230, 232; 250/208.1

(56) References Cited

U.S. PATENT DOCUMENTS

| | | |
|---|---|---|
| 4,611,140 A | 9/1986 | Whitlock et al. |
| 4,908,684 A * | 3/1990 | Koike et al. ................. 257/230 |
| 5,121,214 A | 6/1992 | Turko et al. |
| 5,343,297 A | 8/1994 | Tiemann et al. |
| 5,355,165 A | 10/1994 | Kosonocky et al. |
| 5,440,343 A | 8/1995 | Parulski et al. |
| 5,446,493 A * | 8/1995 | Endo et al. ................. 348/320 |
| 5,614,740 A | 3/1997 | Gardner et al. |
| 5,668,597 A | 9/1997 | Parulski et al. |
| 6,441,853 B1 * | 8/2002 | Furumiya .................... 348/311 |
| 6,512,547 B1 * | 1/2003 | Miida ......................... 348/310 |

* cited by examiner

*Primary Examiner*—Tuan Ho
(74) *Attorney, Agent, or Firm*—Peyton C. Watkins (57) ABSTRACT

A structure for a fast-dump gate for charge coupled devices that does not require a separate contact to a drain region instead using the existing drain of a lateral overflow drain (LOD) typically used for antiblooming purposes. LOD structures are typically used on full-frame CCD image sensors. By using the LOD as the drain for a fast-dump gate, a separate opening in the gate electrode for the drain contact is avoided, thereby making the structure more compact. Gate control is provided by etching a hole in the CCD gate electrode over the overflow channel region of the LOD structure, and overlaying this with one of the subsequent gate electrode layers. This subsequent gate electrode is then used to control the fast-dump operation. Timing is shown for a two-phase CCD being operated with accumulation-mode clocking. Other types of CCDs and clocking schemes may be used. Another advantage of this structure is that it does not require any additional masking or processing steps when built, using a double electrode CCD process that employs a typical LOD structure.

21 Claims, 7 Drawing Sheets

FAST-DUMP STRUCTURE FOR FULL-FRAME IMAGE SENSORS WITH LOD ANTIBLOOMING STRUCTURES

CROSS-REFERENCE TO RELATED APPLICATIONS

The invention is related to U.S. Pat. No. 6,507,056, issued Jan. 14, 2003, entitled FAST LINE DUMP STRUCTURE FOR SOLID STATE IMAGE SENSOR, by Eric G. Stevens, that is commonly assigned as the present invention and filed on the same day as the present application for invention.

FIELD OF THE INVENTION

The field of the invention relates in general to a fast-dump structure for a solid-state image sensor that can be used to selectively dump charge from the main array of the device. In particular, this invention relates to image sensors of the frame transfer or full-frame type, which incorporate lateral-overflow drains (LODs) for blooming protection.

BACKGROUND OF THE INVENTION

Figure 1:
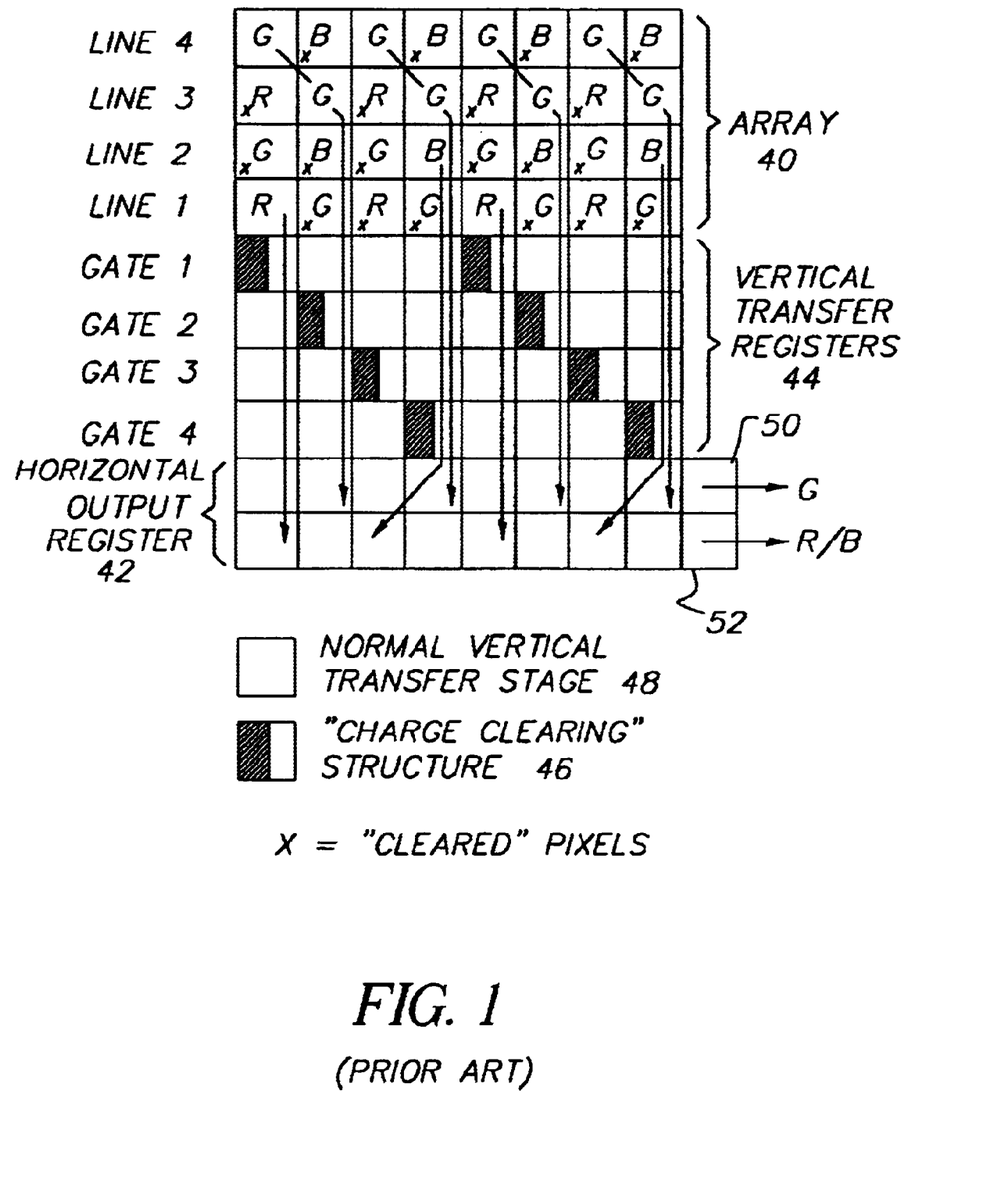
FIG. 1 is a top view of a prior art fast-dump structure from U.S. Pat. No. 5,440,343.
Figures 2A, 2B:
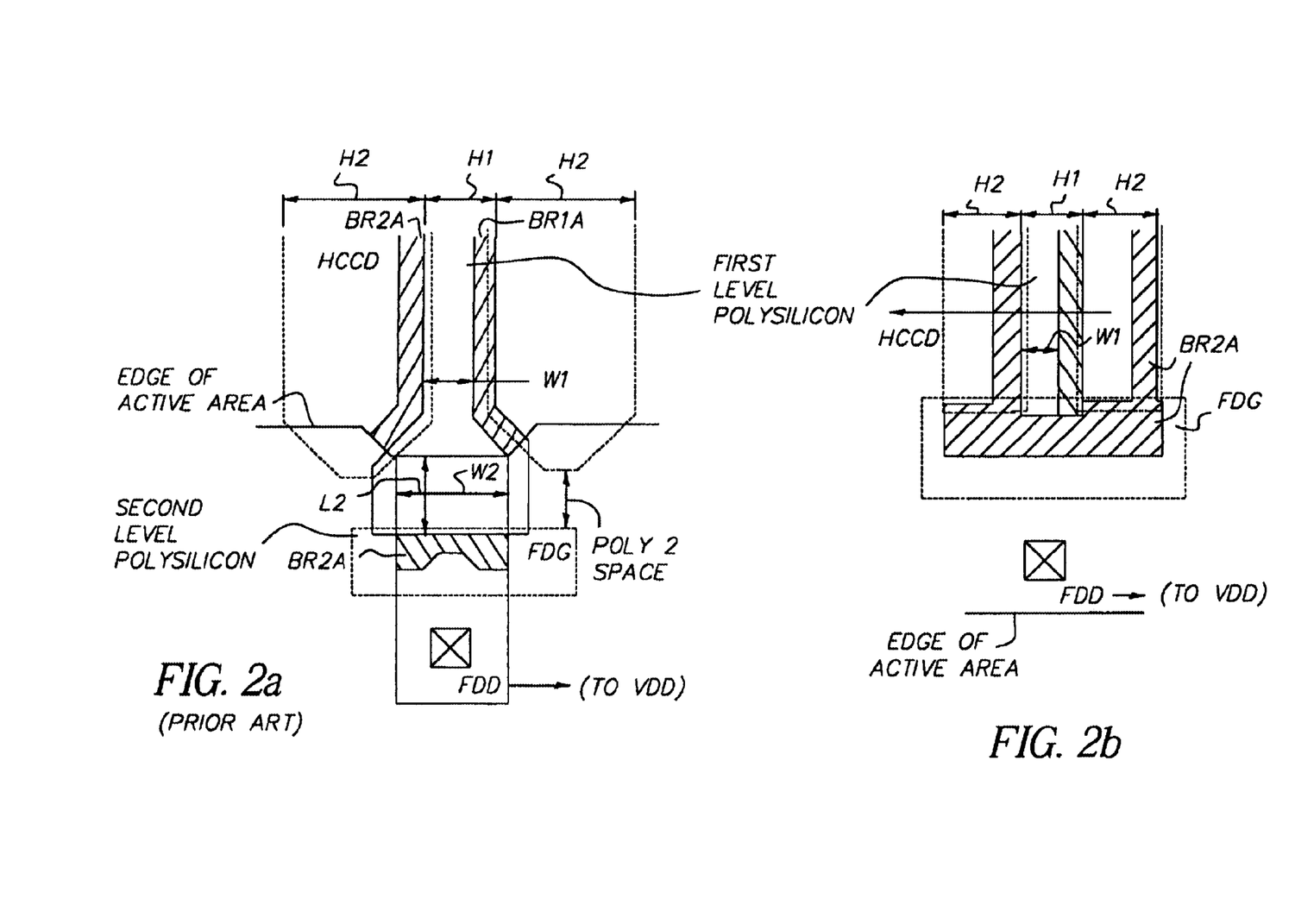
FIG. 2a is a top view of a prior art fast-dump structure.
FIG. 2b is a top view of a fast-dump structure from commonly assigned U.S. Pat. No. 6,507,056.

The fast-dump structure is typically used within prior art devices in the transition area between the vertical and horizontal CCD as shown in FIG. 1. The fast-dump can be used to selectively dump charge from the main array of the device before transfer is made into the horizontal register for effective and fast subsampling of and fast subsampling of the image. These structures can be located at every column of the vertical imaging section, or only at specific locations, (i.e., specific rows and/or columns), as predetermined at the time of design as described in U.S. Pat. No. 5,440,343. However, such prior art devices typically require a contact be made directly to the drain regions of each such structure, thereby putting obvious limitations on the cell sizes that can be realized for a given set of design rules. Although other types of fast-dump structures exist that eliminate the need for a separate contact at each column, such as described in our U.S. Pat. No. 6,507,056 and shown in FIG. 2, these structures have the disadvantage that charge must be transferred through the horizontal shift register which slows down the process.

Other prior art structures, such as described in our Ser. No. 09/533,050, get around the requirement to have a contact at each separate drain by providing a long fast-dump gate and drain below and adjacent the horizontal CCD. However, these types of structures require that charge be transferred through the horizontal CCD and subsequently into the fast-dump structure positioned beneath the HCCD, thereby slowing down the time it takes to perform this fast-dump operation.

Therefore, there is a need within the art to provide a fast-dump structure that can be used on devices with small pixel sizes while at the same time, being able to quickly clear charge from the main section of the array by avoiding the transfer of charge through the horizontal shift register(s).

SUMMARY OF THE INVENTION

The fast-dump structure is typically used within prior art devices in the transition area between the vertical and horizontal CCD as shown in FIG. 1. The fast dump can be used to selectively dump charge from the main array of the device before transfer is made into the horizontal register for effective and fast subsampling of the image. These structures can be located at every column of the vertical imaging section, or only at specific locations, (i.e., specific rows and/or columns), as predetermined at the time of design as described in U.S. Pat. No. 5,440,343. However, such prior art devices typically require a contact be made directly to the drain regions of each such structure, thereby putting obvious limitations on the cell sizes that can be realized for a given set of design rules. (Although other types of fast-dump structures exist that eliminate the need for a separate contact at each column, such as described in our U.S. Pat. No. 6,507,056 and shown in FIG. 2, these structures have the disadvantage that charge must be transferred through the horizontal shift register which slows down the process.)

The primary advantage of this new structure is that it does not require a separate contact to its drain region by using the existing drain of a lateral-overflow drain (LOD) antiblooming structure that is also typically used on full-frame CCD image sensors. (See, for example, U.S. Pat. No. 5,130,774.) By using the LOD as the drain, a separate opening in the gate electrode for the drain contact is avoided, thereby making the structure more compact. Gate control is provided by etching a hole in the CCD gate electrode over particular overflow channel regions of the LOD structure, and overlaying this with one of the subsequent gate electrode layers. This subsequent gate electrode is then used to control the fast-dump operation. The top view, cross-sectional views, and timing diagram for such a structure are shown in FIGS. 4 and 5a–5d. Although timing is shown for a two-phase CCD being operated with accumulation-mode clocking, it is to be understood that other types of CCDs and clocking schemes may be used.

Another advantage of this structure is that it does not require any additional masking or processing steps when built using a double (or more) electrode CCD process that employs a typical LOD structure.

BRIEF DESCRIPTION OF THE DRAWINGS

FIG. 6b is a channel potential diagram for the timing of FIG. 6a.

DETAILED DESCRIPTION OF THE INVENTION

The fast-dump structure is typically used within prior art devices in the transition area between the vertical and horizontal CCD as shown in FIG. 1. The fast dump can be used to selectively dump charge from the main array of the device before transfer is made into the horizontal register for effective and fast subsampling of the image. These structures can be located at every column of the vertical imaging section, or only at specific locations, (i.e., specific rows and/or columns), as predetermined at the time of design as described in U.S. Pat. No. 5,440,343. However, such prior art devices typically require a contact be made directly to the drain regions of each such structure, thereby putting obvious limitations on the cell sizes that can be realized for a given set of design rules. Although other types of fast-dump gate (FDG) structures exist that eliminate the need for a separate contact at each column to remove charge to a fast-dump drain (FDD). Illustrative of such devices are commonly assigned U.S. Pat. No. 6,507,056 as shown in FIG. 2b, and the prior art device as seen in FIG. 2a. These structures have the disadvantage that charge must be transferred through the horizontal shift register (H1, H2) which slows down the process. As used herein, the term multiple phase includes both two-phase and virtual-phase devices as well as devices having more than two phases. A virtual-phase device has one clocked phase and one virtual (non-clocked) phase BR1A and BR2A which refer to barrier implants.

Figure 3:
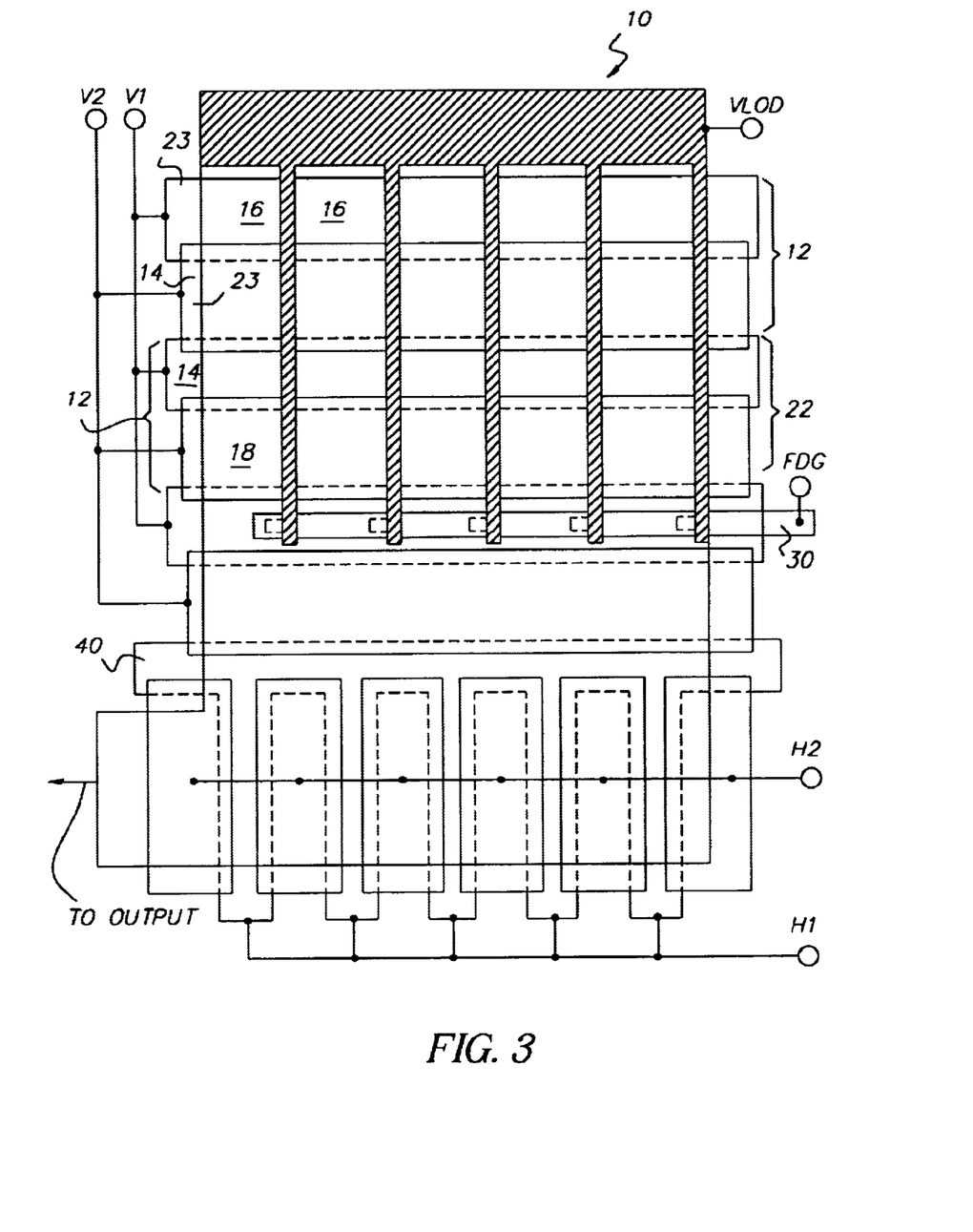
FIG. 3 is a top view of a full-frame image sensor incorporating the new fast-dump structure of the present application.

The present invention provides an image sensing device with a fast-dump gate structure that is an improvement over the prior art designs. Referring to FIG. 3, image sensing device 10 has a plurality of pixels 12 arranged in an array of rows 14 and columns 16. In the preferred embodiment, the image sensing device 10 is a two-phase, full-frame device with columns 16 formed as vertical charge-coupled device shift registers 18. Each of the vertical shift registers 18 has multiple pixels 12 with multiple phases 23 for each of the pixels 12. The preferred embodiment employs full-frame devices as image sensing device 10, because of the inherent advantages for the best mode being a full-frame device. However, the present invention could also be employed on interline-type devices.

FIG. 3 illustrates a two-phase device employed by the preferred embodiment of the present invention having separate phase electrodes $\Phi_1$, $\Phi_2$ within each of the CCD pixels 12. The phase electrodes $\Phi_1$, $\Phi_2$ are electrically connected to voltage sources V1, V2, respectively, to provide alternate pulses to the two phases within the pixels 12 to effect charge transfer within each of the vertical shift register 18 two-phase CCD devices. Each of the phase electrodes $\Phi_1$, $\Phi_2$ for the multiple phases 23 is formed from a separate electrode material resulting in two levels of electrode material. The phase electrodes $\Phi_1$, $\Phi_2$ are shown such that adjacent electrodes overlap. However, employing non-overlapping electrodes for the formation of a multiple phase, charge-transfer device, is known within the relevant art and can be a viable alternative within the context of the present invention. Typically, the phase electrodes $\Phi_1$, $\Phi_2$ are formed from polysilicon, however, there are numerous teachings within the art wherein at least one of the phase electrodes $\Phi_1$, $\Phi_2$ is formed from a different material, such as Indium Tin Oxide (ITO).

The fast-dump gate 30 of the present invention is formed at strategic locations within selected CCD pixels 12 by first forming a hole within one of the phase electrodes $\Phi_1$, $\Phi_2$ within the selected CCD pixels 12. A drain is formed adjacent to the hole to provide for the removal of pixel charges from the selected cells 22 of the vertical CCD shift register 18 which allows for altering the resolution size. The capability for altering resolution sizes is desired in numerous applications such as higher speed applications or for windowing applications where only a subset of the entire pixel array of the image sensing device 10 is desired. In a reduced resolution mode, it is not necessary to output all of the pixel charges through horizontal shift register 40. Therefore, a fast-dump gate electrode 30 is formed to remove undesired pixel data as expeditiously as possible by forming an electrode within the hole adjacent to a drain. The electrode is formed from a different electrode level from that in which the hole is formed allowing control over the draining of pixel charges without effecting the charge transfer within the vertical CCD shift register 18. Once the fast-dump gate electrode 30 is activated by application of a voltage level exceeding a predetermined threshold applied to the fast-dump gate electrode 30, all charges within the CCD cells 22 having a fast-dump gate electrode 30 will be removed. Charge can be drained from the selected vertical CCDs for any selected row, or for any number of selected rows within image sensing device 10. In the preferred embodiment, the CCD is a two-phase device, having two levels of electrode material (polysilicon, ITO or other electrode material). The hole within the preferred embodiment is formed in the first electrode level and the fast-dump gate electrode 30 is then formed over the hole from the second level of electrode material. This allows the fast-dump gate electrode 30 to be isolated from the first electrode level in which it is formed enabling independent operation of the fast-dump gate electrode 30 without effecting the operation of the vertical CCD shift register 18. The fast-dump gate electrode 30 within the preferred embodiment is formed in corresponding cells 22 within each of the columns 16 of the CCD such that an entire row of pixels can be drained from the charge coupled devices. Within the preferred embodiment, the drain used to form the fast-dump gate is a lateral overflow drain structure and the CCD is preferably a full-frame device.

Figure 4:
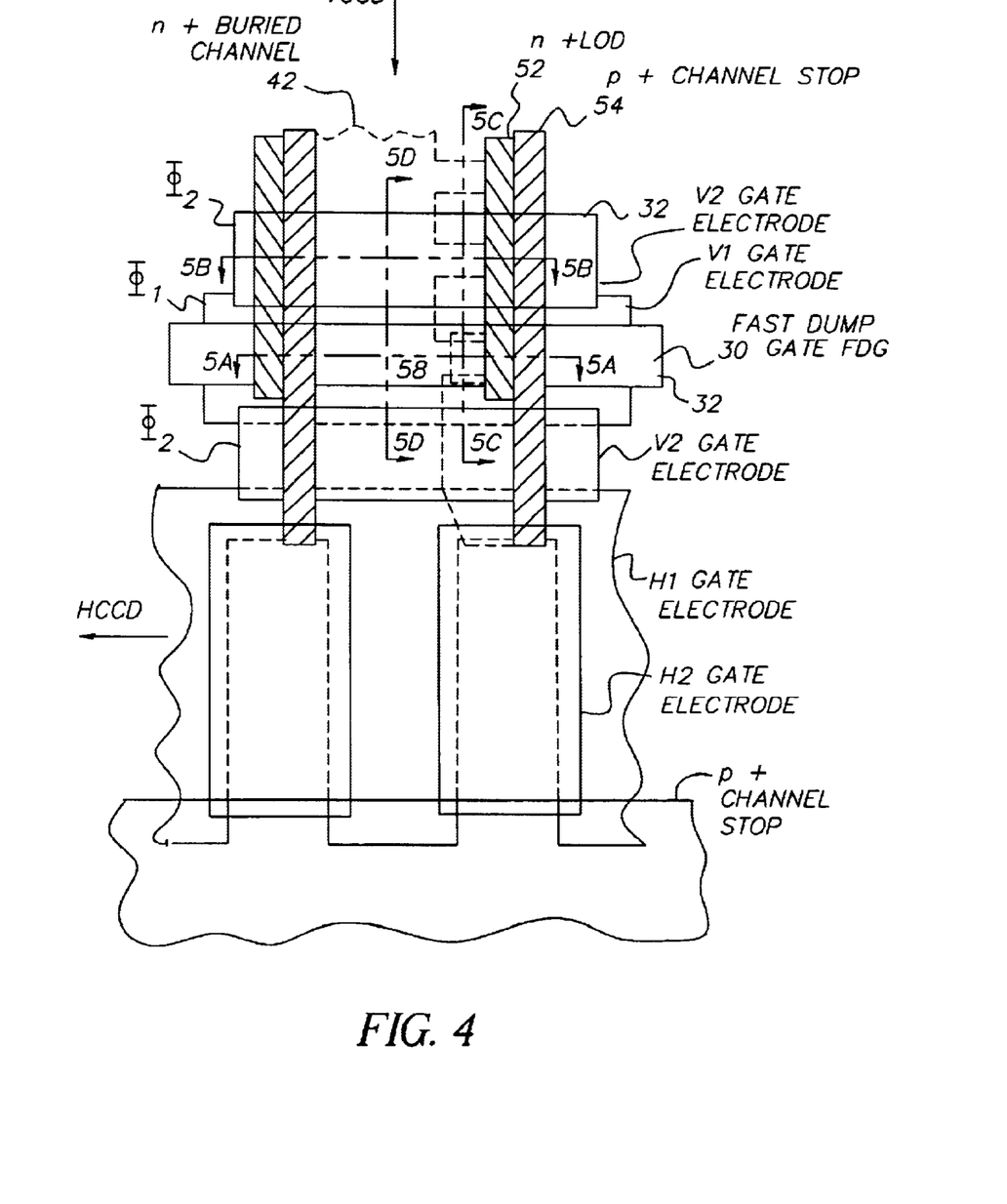
FIG. 4 is a top view of the new fast-dump structure.

FIG. 4 is a top view of a portion of image sensing device 10 that has been selected to show the features and structure of the new fast-dump gate 30. As shown in FIG. 4, the phase-1 electrode $\Phi_1$ is electrically connected to voltage source V1, and the phase-2 electrode $\Phi_2$ is electrically connected to voltage source V2 to create the two-phase, image sensing device 10 of the preferred embodiment. The fast-dump gate 30 electrode is preferably formed within the phase-1 electrode $\Phi_1$ area because this is the last phase in the cell which facilitates an efficient dump of all the charge contained within a cell. While it will be understood to those skilled in the art, that the fast-dump gate 30 can be formed in any of the phases, it is preferably formed within the last phase of the cell. This is illustrated in the frame transfer, image sensing device 10 of the preferred embodiment wherein charge from phase-1 electrode $\Phi_1$ is drained via the fast-dump gate 30 prior to charge from the phase-2 electrode $\Phi_2$ being shifted into the phase-1 electrode $\Phi_1$ area where this charge is also drained via fast-dump gate 30. The organization of having the last phase contain fast-dump gate 30 is consistent before charge is transferred out of the cell, and it is desirable to remove all the charge from the cell via the fast-dump gate 30 structure. Therefore, the last phase within a cell is the preferred phase for placement of the fast-dump gate 30 structure.

Still referring to FIG. 4, the frame transfer, image sensing device 10 has the fast-dump gate 30 structure formed within cell 32 that consists of two phases as previously discussed. Each of the columns 16 within sensing has a lateral overflow drain (LOD) 52 on one side of the column 16 that, within the preferred embodiment, is formed from an n+ material. On the side of each column 16, opposite the LOD 52, a channel stop 54 is formed from a p+ material. The columns 16 have the LOD 52 and channel stop 54 formed within a p-type epitaxial layer formed on a p-type substrate. An n-type buried channel 42 is formed within the portions of the column 16 that is intended to transfer charge through the various phases. The n-type buried channel 42 will exist throughout the image sensor device 10 except in the areas that are adjacent LOD 52 and the junction edges of the phase electrodes $\Phi_1$, $\Phi_2$. Therefore, fingers of the n-type channel 42 will reach the n+ type LOD 52 in the center areas of the phase electrodes $\Phi_1$, $\Phi_2$ as seen in FIG. 4. In the cells where the fast-dump gates 30 are formed, a trench is formed in the center of the phase electrode over the finger of n-type buried channel 42 that extends towards LOD 52 as seen in FIG. 4.

Figure 5A:
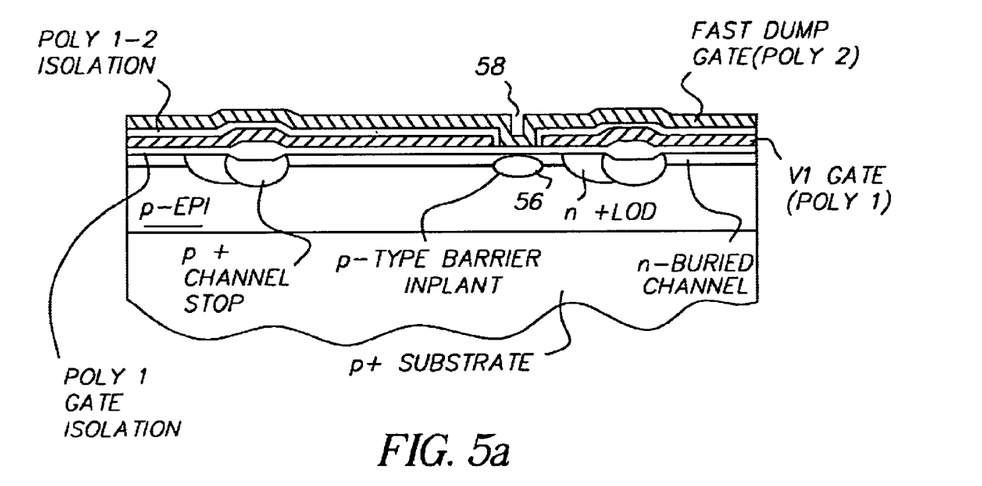
FIG. 5a is a cross-sectional view through line A—A of FIG. 4.

FIG. 5a is a cross-sectional view taken through line A—A of FIG. 4 wherein the p-type barrier implant 56 is shown beneath notch 58. This p-type barrier implant 56 is along the edge of column 16 near LOD 52. In addition to the trench formed in the electrode running along the longitudinal axis as previously discussed, there is also a notch 58 formed over the p-type barrier implant 56 as seen in FIG. 5a.

Figure 5B:
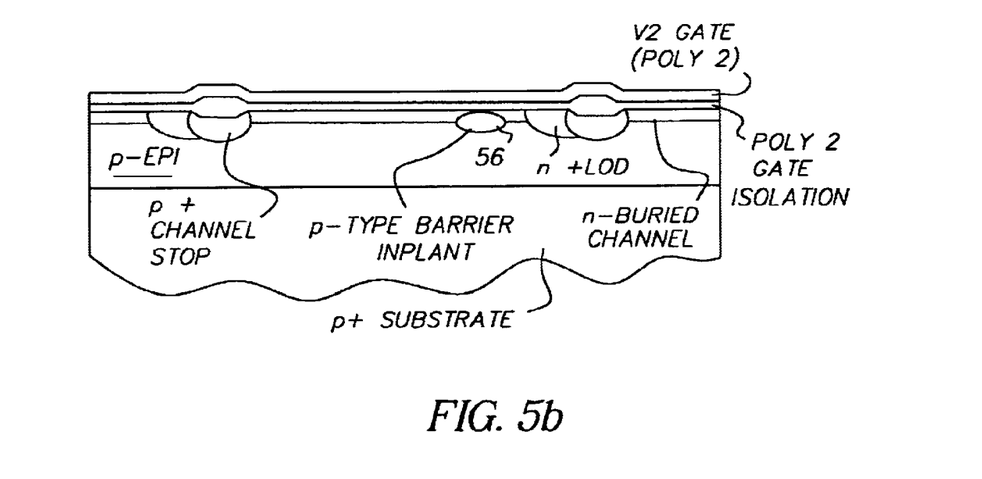
FIG. 5b is a cross-sectional view through line B—B of FIG. 4.

FIG. 5b is a cross-sectional view taken through line B—B of FIG. 4 illustrating the entire width of a phase not having a fast-dump gate 30. By comparing FIGS. 5a and 5b, the only difference in these figures is notch 58 illustrated in FIG. 5a contained in the phase having a fast-dump gate 30. Both of these figures contain the p-type barrier implant 56 that provides a threshold for charges to the LOD 52. The phases that do not have a fast-dump gate 30, such as that illustrated in FIG. 5b, still have a p-type barrier implant 56.

Figure 5C:
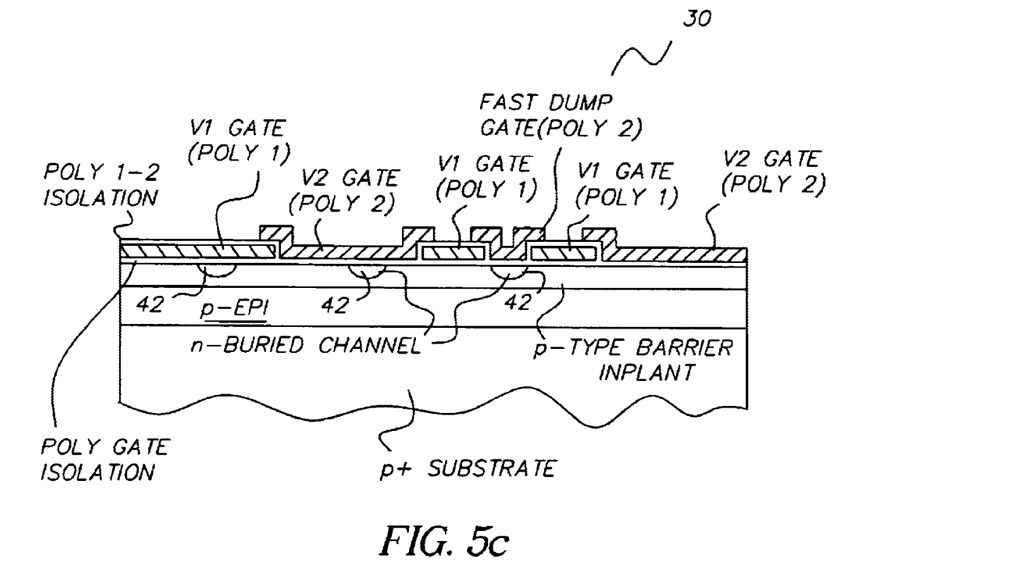
FIG. 5c is a cross-sectional view through line C—C of FIG. 4.

FIG. 5c is a cross-sectional view of line C—C of FIG. 4 illustrating a typical charge transfer path for one of the columns including a phase having a fast-dump gate 30. FIG. 5c is a view directly through notch 58 to illustrate the formation of the fast-dump gate 30 structure of the present invention in conjunction with the previously discussed FIG. 5a. Various fingers like outcrops of n-type buried channel 42 can be seen within each of the phases beneath the center of each electrode embedded within the a p-type barrier implant layer 56. Also, the p-type barrier implant 56 that runs along the entire column is evident within FIG. 5c. The fast-dump gate 30 in the preferred embodiment is placed directly on top of the n-type buried channel 42 outcrops for the phase selected to contained the fast-dump gate 30.

Figure 5D:
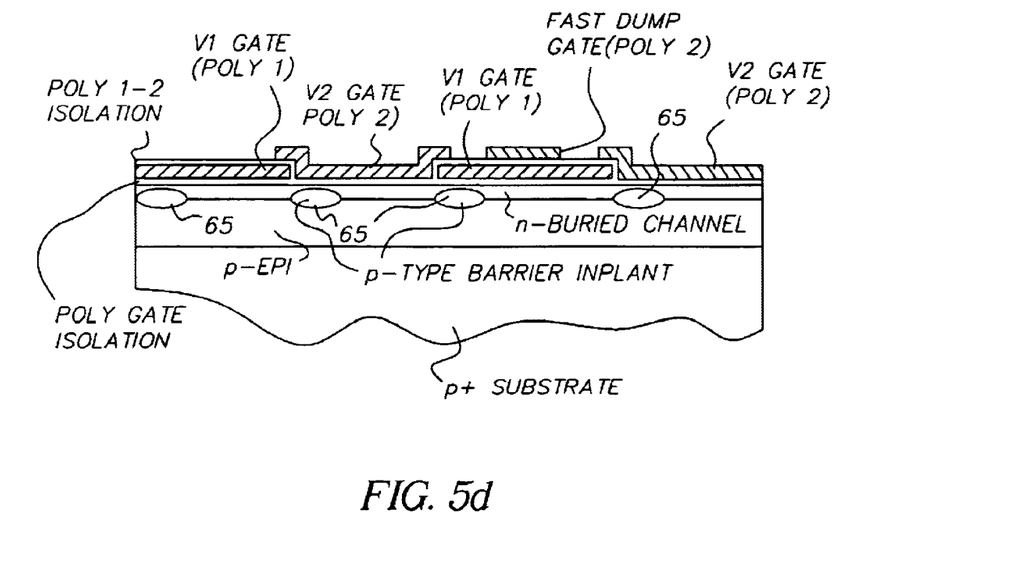
FIG. 5d is a cross-sectional view through line D—D of FIG. 4.

In FIG. 5d which is a cross-sectional view through line D—D of FIG. 4. This cross section illustrates the structure of the preferred embodiment along a line parallel to that discussed above for FIG. 5c only farther towards the center of each of the charge transfer cells. P-type barrier implants 65 are placed at the edge of each the electrodes to provide a potential threshold between each of the phases.

Figure 6A:
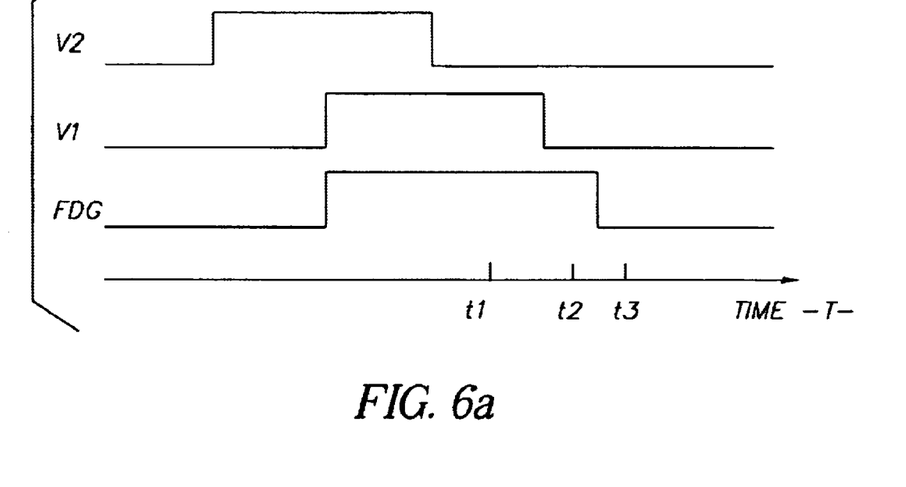
FIG. 6a is a sample timing diagram for the fast-dump structure of FIG. 4.
Figure 6B:
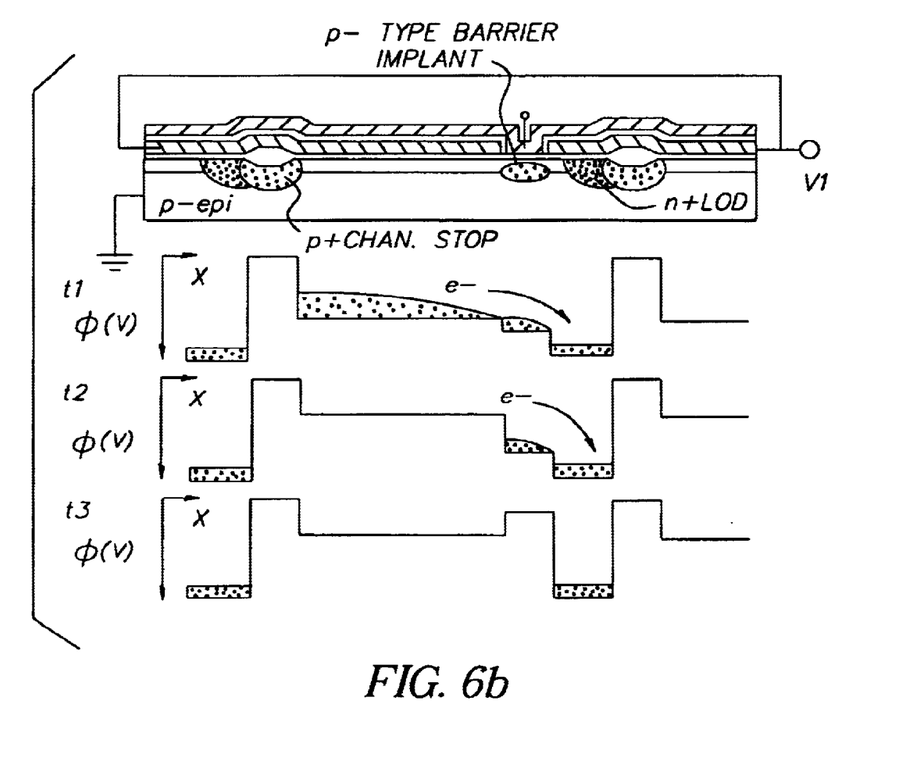

FIG. 6a is a sample timing diagram for the fast-dump structure of FIG. 4. FIG. 6b is a channel potential diagram for the fast-dump structure of FIG. 4 illustrating the operation of the fast-dump gate 30 wherein the charges contained in that phase get dumped into the lateral overflow drain 52.

The primary advantage of this new structure fast-dump gate 30 provides a structure that does not require a separate contact to a drain region instead using the existing drain of a lateral-overflow drain (LOD) typically used for antiblooming purposes. LOD structures are typically used on full-frame CCD image sensors. By using the LOD as the drain for fast-dump gate 30, a separate opening in the gate electrode for the drain contact is avoided, thereby making the structure more compact. Gate control is provided by etching a hole in the CCD gate electrode over the overflow channel region of the LOD structure, and overlaying this with one of the subsequent gate electrode layers. This subsequent gate electrode is then used to control the fast-dump operation. The top view, cross-sectional views, and timing diagram for such a structure are shown in FIGS. 4 through 6b. Although timing is shown for a two-phase CCD being operated with accumulation-mode clocking, it is to be understood that other types of CCDs and clocking schemes may be used.

Another advantage of this structure is that it does not require any additional masking or processing steps when built using a double (or more) electrode CCD process that employs a typical LOD structure.

The foregoing description has described the best mode know to the inventors for practicing the invention, variations in the best mode will be readily apparent to those skilled in the relevant art. Accordingly, the scope of the invention should be measured by the appended claims.

PARTS LIST 10 image sensing device
12 pixels
14 rows
16 columns
18 vertical shift register
22 cells
23 phases
30 fast-dump gate
32 cells
40 horizontal shift register
42 n-type buried channel
52 lateral overflow drain (LOD)
54 p-+ channel stop
56 p-type barrier implant
58 notch
65 p-type barrier implant
V1 voltage source
V2 voltage source
$\Phi_1$ phase electrode
$\Phi_2$ phase electrode

What is claimed is:

1. An image sensing device comprising:
   a plurality of pixels arranged in an array of rows and columns;
   a plurality of vertical charge coupled device shift registers used to form the columns, the vertical charge coupled devices defining the pixels where each of the pixels have multiple phases;
   a plurality of electrodes formed upon the image sensing device such that there is at least one electrode for each pixel;
   a hole being formed within the electrode of at least one of the pixels, the hole having a dump electrode formed therein, the dump electrode being formed from a subsequent level of electrode material from the electrode containing the hole; and
   a drain adjacent to pixel wherein the dump electrode is operatively connected to a drain.

2. The image sensing device of claim 1 wherein the drain structure is a lateral overflow drain structure buried within the substrate.

3. The image sensing device of claim 1 wherein the hole is formed over a barrier implanted region.

4. The image sensing device of claim 1 wherein the image sensing device is a full frame charge coupled device.

5. The image sensing device of claim 1 wherein the image sensing device is a full frame device formed within a substrate of a first conductivity having a buried channel of a second conductivity of opposite polarity from the first conductivity.

6. The image sensing device of claim 5 wherein the buried channel for each of the phases leads to an overflow drain through a potential barrier.

7. The image sensing device of claim 6 wherein the buried channel is formed beneath the hole.

8. The image sensing device of claim 7 wherein the electrode over the hole is configured to allow application of a predetermined potential to overcome the potential barrier and allow charge stored in that pixel to flow into the overflow drain.

9. The image sensing device of claim 1 wherein the hole is formed in a plurality of pixels to create at predetermined resolution for the image sensing device that is less than full resolution.

10. The image sensing device of claim 9 wherein the device is a two phase device and the holes are formed in the first phase.

11. An image sensing device comprising:

a plurality of pixels arranged in an array of rows and columns;

a plurality of vertical charge coupled device shift registers used to form the columns, the vertical charge coupled devices defining the pixels where each of the pixels have multiple phases;

a plurality of electrodes formed upon the image sensing device such that there is at least one electrode for each of the phases within the pixels;

a hole being formed within the electrode of at least one of the pixels, the hole having a dump electrode formed therein, the dump electrode being formed from a subsequent level of electrode material from the electrode containing the hole; and a drain adjacent to pixel wherein the dump electrode is operatively connected to a drain.

12. The image sensing device of claim 11 wherein the drain structure is a lateral overflow drain structure buried within the substrate.

13. The image sensing device of claim 11 wherein the hole is formed over a barrier implanted region.

14. The image sensing device of claim 11 wherein the image sensing device is a full frame charge coupled device.

15. The image sensing device of claim 11 wherein the image sensing device is a full frame device formed within a substrate of a first conductivity having a buried channel of a second conductivity of opposite polarity from the first conductivity.

16. The image sensing device of claim 15 wherein the buried channel for each of the phases leads to an overflow drain through a potential barrier.

17. The image sensing device of claim 16 wherein the buried channel is formed beneath the hole.

18. The image sensing device of claim 17 wherein the electrode over the hole is configured to allow application of a predetermined potential to overcome the potential barrier and allow charge stored in that pixel to flow into the overflow drain.

19. The image sensing device of claim 11 wherein the hole is formed in a plurality of pixels to create at predetermined resolution for the image sensing device that is less than full resolution.

20. The image sensing device of claim 19 wherein the device is a two phase device and the holes are formed in the first phase.

21. A process for making an image sensing device comprising the steps of:

providing the image sensing device having plurality of pixels arranged in an array of rows, with each of the columns being column formed a vertical charge coupled device shift register with a plurality of pixels being formed within each of the vertical charge coupled devices, wherein each of the pixels have multiple phases and further providing a plurality of electrodes upon the image sensing device such that there is at least one electrode for each pixel;

forming a hole being formed within the electrode of at least one of the pixels, the hole having a dump electrode formed therein, the dump electrode being formed from a subsequent level of electrode material from the electrode containing the hole; and creating a drain adjacent to pixel wherein the dump electrode is operatively connected to a drain.

\* \* \* \* \*